United States Patent
Kim

(10) Patent No.: US 8,017,479 B2
(45) Date of Patent: Sep. 13, 2011

(54) SEMICONDUCTOR DEVICE HAVING MULTI-CHANNEL AND METHOD OF FABRICATING THE SAME

(75) Inventor: Dae Sik Kim, Kyeongki-do (KR)

(73) Assignee: Hynix Semiconductor Inc., Icheon-si, Kyoungki-do (KR)

( * ) Notice: Subject to any disclaimer, the term of this patent is extended or adjusted under 35 U.S.C. 154(b) by 0 days.

(21) Appl. No.: 12/754,273

(22) Filed: Apr. 5, 2010

(65) Prior Publication Data

US 2010/0190325 A1  Jul. 29, 2010

Related U.S. Application Data

(62) Division of application No. 11/954,610, filed on Dec. 12, 2007, now Pat. No. 7,719,038.

(30) Foreign Application Priority Data

Apr. 17, 2007  (KR) .................................. 2007-37335

(51) Int. Cl.
*H01L 21/336* (2006.01)

(52) U.S. Cl. ........ 438/259; 438/257; 438/282; 438/283; 438/284; 438/288; 257/241; 257/287; 257/E21.209; 257/E21.421; 257/E21.431; 257/E21.444; 257/E29.264; 257/E29.275

(58) Field of Classification Search .................. 438/259, 438/257, 282, 283, 284, 288; 257/241, 287, 257/E21.209, E21.421, E21.431, E21.444, E29.264, E29.275

See application file for complete search history.

(56) References Cited

U.S. PATENT DOCUMENTS

| | | |
|---|---|---|
| 6,413,802 B1 | 7/2002 | Hu et al. |
| 7,368,348 B2 | 5/2008 | Lee |
| 2004/0063286 A1 | 4/2004 | Kim et al. |
| 2005/0196947 A1* | 9/2005 | Seo et al. ...................... 438/589 |
| 2005/0285204 A1 | 12/2005 | Kim et al. |
| 2006/0240622 A1 | 10/2006 | Lee et al. |

FOREIGN PATENT DOCUMENTS

| | | |
|---|---|---|
| KR | 1020040029582 | 4/2004 |
| KR | 1020060054667 | 5/2008 |

OTHER PUBLICATIONS

Korean Notice of Allowance for Korean application No. 10-2007-0037335, citing the above foreign patent documents.

* cited by examiner

*Primary Examiner* — Long Tran
(74) *Attorney, Agent, or Firm* — Lowe Hauptman Ham & Berner LLP

(57) ABSTRACT

An embodiment of the present invention relates to a semiconductor device having a multi-channel and a method of fabricating the same. In an aspect, the semiconductor device includes a semiconductor substrate in which isolation layers are formed, a plurality of trenches formed within an active region of the semiconductor substrate, and a channel active region configured to connect opposite sidewalls within each trench region and having a surface used as a channel region.

15 Claims, 16 Drawing Sheets

SEMICONDUCTOR DEVICE HAVING MULTI-CHANNEL AND METHOD OF FABRICATING THE SAME

CROSS-REFERENCES TO RELATED APPLICATIONS

This application is a divisional of U.S. Ser. No. 11/954,610, filed on Dec. 12, 2007. This application, in its entirety, is incorporated herein by reference.

The present application claims priority to Korean patent application number 10-2007-37335, filed on Apr. 17, 2007, which is incorporated by reference in its entirety.

BACKGROUND OF THE INVENTION

The present invention relates to a semiconductor device having a multi-channel and a method of fabricating the same and, more particularly, to a multi-channel semiconductor device and a method of fabricating the same, in which the number of channels can be increased by changing the shape of an active region.

In general, a semiconductor device performs such operations as writing and reading data by enabling current to flow through channels. Conventionally, the channel formed within the active region of the semiconductor memory device has had a single two-dimensional structure. However, as the degree of integration of semiconductor devices increases, a channel length and width become limited in size, and the electron mobility decreases due to an increase of channel doping. Thus, it becomes difficult to secure a sufficient channel current.

To solve the problems, a semiconductor device having a multi-channel has been fabricated. In order for a semiconductor device to have a multi-channel, the device has been fabricated to have a three-dimensional structure, such as a bulb recessed gate (BRG), a recessed cell array transistor (RCAT) and a fin field effect transistor (FinFET). The semiconductor device having the three-dimensional structure can have two or three channels. Thus, more operating current can flow through the semiconductor device when compared with semiconductor devices of a two-dimensional planar structure.

However, as the degree of integration of semiconductor devices increases, higher current drivability is required. To solve this problem, a larger number of channels have to be formed.

BRIEF SUMMARY OF THE INVENTION

The present invention is directed towards a semiconductor device, which has a plurality of channels by changing the shape of an active region of a semiconductor substrate before forming a gate electrode, and a method of fabricating the same.

Furthermore, the present invention discloses a semiconductor device having a multi-channel and a method of fabricating the same, in which a part of a top surface of an active region is removed by performing a first etch process using a first mask film pattern, and holes are formed within the removed active region by performing a second etch process employing a second mask film pattern, obtaining a desired number of channels, so that the current driving capability of the semiconductor device can be improved.

In one embodiment, a semiconductor device having a multi-channel includes a semiconductor substrate in which isolation layers are formed, a plurality of trenches formed within an active region of the semiconductor substrate, and a channel active region configured to connect opposite sidewalls within each trench region and having a surface used as a channel region.

The channel active region has a cross section of a square. The channel active region is lower than a top surface of the active region, higher than a bottom surface of the trench, and does not touch the isolation layers within the trench. Two channel active regions are formed within one trench, and eight sides of the channel active regions are used as the channel region.

In another embodiment, a semiconductor device having a multi-channel includes a semiconductor substrate in which isolation layers are formed, at least a trench formed within an active region of the semiconductor substrate, and channel active regions configured to project from opposite sidewalls and to connect the other opposite sidewalls within each trench region at an intermediate depth of the trench and having a surface used as a channel region.

The projections are respectively formed on opposite sidewalls of the insulating layers. Each of the projected channel active regions has a cross section of square, and three sides of the projected channel active regions exposed to both sidewalls of the trench are used as the channel region.

In still another embodiment, a method of fabricating a semiconductor device includes forming a first trench in an active region of a semiconductor substrate having isolation layers formed therein, performing a first etch process in order to form second trenches on both sides within the first trench, and performing a second etch process in order to form a channel active region in which third trenches are interconnected at a depth deeper than that of the second trenches so that opposite sidewalls are interconnected while forming the third trenches deeper than the second trenches.

Four channel regions are formed through four surfaces of the channel active region.

Before the first trenches are formed, the method further comprises performing first to fifth ion implantation processes on the semiconductor substrate.

The first ion implantation process is performed by using boron (B) ions at a concentration of 2.0E13, with energy of 300 keV, and at an angle of 3.2 degrees.

The second ion implantation process is performed by using boron (B) ions at a concentration of 3.0E12, with energy of 120 keV, and at an angle of 7 degrees.

The third ion implantation process is performed by using boron (B) ions at a concentration of 9.0E12, with energy of 45 keV, and at an angle of 7 degrees.

The fourth ion implantation process is performed by using phosphorous (P) ions at a concentration of 6.0E12, with energy of 25 keV, and at an angle of 7 degrees.

The fifth ion implantation process is performed by using arsenic (As) ions at a concentration of 8.0E12, with energy of 20 keV, and at an angle of 7 degrees.

The formation of the first trench includes forming a first hard mask film and a first photoresist pattern over the semiconductor substrate in which the isolation layers are formed, performing an etch process along the first photoresist pattern to pattern the first hard mask film, removing the first photoresist pattern, performing an etch process along the patterned first hard mask film to remove a part of the semiconductor substrate, and removing the patterned first hard mask film.

A width of an opened region of the first photoresist pattern ranges from 65 to 75 angstrom.

The first trench is formed in a depth of 15 nm to 25 nm.

The first etch process includes forming a second hard mask film and a second photoresist pattern over the semiconductor substrate in which the first trenches are formed, patterning the second hard mask film along the second photoresist pattern, removing the second photoresist pattern, and removing a part of the semiconductor substrate along the patterned second hard mask film.

The first etch process is performed by using an anisotropic dry etch process.

The second trench is formed in a depth of 80 to 90 nm.

After the second trenches are formed, the method further comprises forming an etch protection layer along a surface of the semiconductor substrate in which the second trenches are formed, and performing an etch process to remove the etch protection layer below the second trenches while having the etch protection layer on the sidewalls of the second trenches remain.

The etch protection layer is formed of a nitride layer or an oxide layer.

The etch process is performed by using an anisotropic dry etch process.

The second etch process is performed by using an isotropic dry etch process using a plasma type equipment. The isotropic dry etch process is performed by injecting an etch gas at a pressure of 1 mTorr to 100 mTorr and a plasma density of 1E5 to 1E12 by using plasma source power of 1 W to 1000 W and 1V to 500V at a temperature of −50 to 50 degrees Celsius. The etch gas employs a mixed gas of $CF_4$, Ar, $Cl_2$, HBr, $SF_6$ and $O_2$.

After the second etch process is performed, a cleaning process is performed. The cleaning process is performed by using BOE in which $NH_4F$ and HF are mixed at a ratio of 1 to 1000:1, a solution in which HF and DI water are mixed at a ratio of 1 to 1000:1, or a solution in which $NH_4OH$, $H_2O_2$ and $H_2O$ are mixed.

After performing the second etch process, further comprises forming a gate insulating layer over the semiconductor substrate in which the channel active region is formed, forming a gate electrode layer over the semiconductor substrate so that the trenches in which the channel active region is formed are gap-filled, forming a gate hard mask film pattern on the gate electrode layer, and patterning the gate electrode layer and the gate insulating layer along the gate hard mask film pattern.

The gate electrode layer has a stack structure of a polysilicon layer, a barrier metal layer and a metal layer.

In still another embodiment, a method of fabricating a semiconductor device includes forming a first trench in an active region of a semiconductor substrate having isolation layers formed therein, performing a first etch process in order to form a second trench at a center of the first trench, and performing a second etch process in order to form projected channel active regions on opposite sidewalls by widening a width of third trenches at a depth deeper than that of the second trenches while forming the second trenches to be the third trenches deeper than the second trenches.

Each of the projected channel active regions include three channel regions through three sides except for surfaces contacting the isolation layers, so that six channel regions are formed.

Before the first trenches are formed, the method further comprises performing first to fifth ion implantation processes on the semiconductor substrate.

The first ion implantation process is performed by using boron (B) ions at a concentration of 2.0E13, with energy of 300 keV, and at an angle of 3.2 degrees.

The second ion implantation process is performed by using boron (B) ions at a concentration of 3.0E12, with energy of 120 keV, and at an angle of 7 degrees.

The third ion implantation process is performed by using boron (B) ions at a concentration of 9.0E12, with energy of 45 keV, and at an angle of 7 degrees.

The fourth ion implantation process is performed by using phosphorous (P) ions at a concentration of 6.0E12, with energy of 25 keV, and at an angle of 7 degrees.

The fifth ion implantation process is performed by using arsenic (As) ions at a concentration of 8.0E12, with energy of 20 keV, and at an angle of 7 degrees.

The formation of the first trenches comprises forming a first hard mask film and a first photoresist pattern over the semiconductor substrate in which the isolation layers are formed, performing an etch process along the first photoresist pattern to pattern the first hard mask film, removing the first photoresist pattern, performing an etch process along the patterned first hard mask film to remove a part of the semiconductor substrate, and removing the patterned first hard mask film.

A width of an opened region of the first photoresist pattern ranges from 65 to 75 angstrom.

The first trench is formed in a depth of 15 nm to 25 nm.

The first etch process comprises forming a second hard mask film and a second photoresist pattern over the semiconductor substrate in which the first trenches are formed, patterning the second hard mask film along the second photoresist pattern, removing the second photoresist pattern, and removing a part of the semiconductor substrate along the patterned second hard mask film.

The first etch process is performed by using an anisotropic dry etch process.

The second trench is formed in a depth of 80 to 90 nm.

After the second trenches are formed, the method further comprises forming an etch protection layer along a surface of the semiconductor substrate in which the second trenches are formed, and performing an etch process to remove the etch protection layer below the second trenches while having the etch protection layer on the sidewalls of the second trenches remain.

The etch protection layer is formed of a nitride layer or an oxide layer.

The etch process is performed by using an anisotropic dry etch process.

The second etch process is performed by using an isotropic dry etch process using a plasma type equipment.

The isotropic dry etch process is performed by injecting an etch gas at a pressure of 1 mTorr to 100 mTorr and a plasma density of 1E5 to 1E12 by using plasma source power of 1 W to 1000 W and 1V to 500V at a temperature of −50 to 50 degrees Celsius.

The etch gas employs a mixed gas of $CF_4$, Ar, $Cl_2$, HBr, $SF_6$ and $O_2$.

After the second etch process is performed, a cleaning process is performed.

The cleaning process is performed by using BOE in which $NH_4F$ and HF are mixed at a ratio of 1 to 1000:1, a solution in which HF and DI water are mixed at a ratio of 1 to 1000:1, or a solution in which $NH_4OH$, $H_2O_2$ and $H_2O$ are mixed.

After performing the second etch process, the method further comprises forming a gate insulating layer over the semiconductor substrate in which the projected channel active region is formed forming a gate electrode layer over the semiconductor substrate so that the trenches in which the projected channel active region is formed are gap-filled, forming a gate hard mask film pattern on the gate electrode layer, and patterning the gate electrode layer and the gate insulating layer along the gate hard mask film pattern.

The gate electrode layer has a stack structure of a polysilicon layer, a barrier metal layer and a metal layer.

In still another embodiment, a method of fabricating a semiconductor device includes forming a first trench in an active region of a semiconductor substrate having isolation layers formed therein, performing a first etch process in order to form second trenches on both sides and at a center of the first trench, and performing a second etch process in order to form at least two channel active regions in which third trenches are interconnected at a depth deeper than that of the second trenches so that opposite sidewalls are interconnected while forming the third trenches deeper than the second trenches.

Each of the channel active regions includes four channel regions through four sides, so that at least eight channel regions are formed.

Before the first trenches are formed, the method further comprises performing first to fifth ion implantation processes on the semiconductor substrate.

The first ion implantation process is performed by using boron (B) ions at a concentration of 2.0E13, with energy of 300 keV, and at an angle of 3.2 degrees.

The second ion implantation process is performed by using boron (B) ions at a concentration of 3.0E12, with energy of 120 keV, and at an angle of 7 degrees.

The third ion implantation process is performed by using boron (B) ions at a concentration of 9.0E12, with energy of 45 keV, and at an angle of 7 degrees.

The fourth ion implantation process is performed by using phosphorous (P) ions at a concentration of 6.0E12, with energy of 25 keV, and at an angle of 7 degrees.

The fifth ion implantation process is performed by using arsenic (As) ions at a concentration of 8.0E12, with energy of 20 keV, and at an angle of 7 degrees.

The formation of the first trenches comprises forming a first hard mask film and a first photoresist pattern over the semiconductor substrate in which the isolation layers are formed, performing an etch process along the first photoresist pattern to pattern the first hard mask film, removing the first photoresist pattern, performing an etch process along the patterned first hard mask film to remove a part of the semiconductor substrate, and removing the patterned first hard mask film.

A width of an opened region of the first photoresist pattern ranges from 65 to 75 angstrom.

The first trench is formed in a depth of 15 nm to 25 nm.

The first etch process comprises forming a second hard mask film and a second photoresist pattern over the semiconductor substrate in which the first trenches are formed, patterning the second hard mask film along the second photoresist pattern, removing the second photoresist pattern, and removing a part of the semiconductor substrate along the patterned second hard mask film.

The first etch process is performed by using an anisotropic dry etch process.

The second trench is formed in a depth of 80 to 90 nm.

After the second trenches are formed, the method further comprises forming an etch protection layer along a surface of the semiconductor substrate in which the second trenches are formed, and performing an etch process to remove the etch protection layer below the second trenches while having the etch protection layer on the sidewalls of the second trenches remain.

The etch protection layer is formed of a nitride layer or an oxide layer.

The etch process is performed by using an anisotropic dry etch process.

The second etch process is performed by using an isotropic dry etch process using a plasma type equipment.

The isotropic dry etch process is performed by injecting an etch gas at a pressure of 1 mTorr to 100 mTorr and a plasma density of 1E5 to 1E12 by using plasma source power of 1 W to 1000 W and 1V to 500V at a temperature of −50 to 50 degrees Celsius.

The etch gas employs a mixed gas of $CF_4$, Ar, $Cl_2$, HBr, $SF_6$ and $O_2$.

After the second etch process is performed, a cleaning process is performed.

The cleaning process is performed by using BOE in which $NH_4F$ and HF are mixed at a ratio of 1 to 1000:1, a solution in which HF and DI water are mixed at a ratio of 1 to 1000:1, or a solution in which $NH_4OH$, $H_2O_2$ and $H_2O$ are mixed.

after performing the second etch process, the method further comprises forming a gate insulating layer over the semiconductor substrate in which the channel active region is formed, forming a gate electrode layer over the semiconductor substrate so that the trenches in which the channel active region is formed are gap-filled, forming a gate hard mask film pattern on the gate electrode layer, and patterning the gate electrode layer and the gate insulating layer along the gate hard mask film pattern.

The gate electrode layer has a stack structure of a polysilicon layer, a barrier metal layer and a metal layer.

DESCRIPTION OF SPECIFIC EMBODIMENTS

Now, specific embodiments according to the present invention will be described with reference to the accompanying drawings.

FIGS. 1A to 1J are sectional views illustrating a method of fabricating a semiconductor device according to an embodiment of the present invention.

FIGS. 1A to 1J are sectional views illustrating a method of fabricating a semiconductor device having four channels. Here, FIGS. 1A to 1C and FIGS. 1I to 1J are sectional views taken along line A-A' of FIG. 2A which illustrates a three-dimensional view of an active region according to the present embodiment while FIGS. 1D to 1H are taken along line B-B'. The fabrication method of the semiconductor device is described below with reference to FIG. 1A. A mask film pattern (not shown) is formed on a semiconductor substrate 100 in which wells are formed. A part of the semiconductor substrate 100 is removed by performing an etch process along the mask film pattern (not shown), thus forming trenches 101. The trenches 101 are filled with an insulating layer to form isolation layers 102. After the isolation layers 102 are formed, chemical mechanical polishing (CMP) is performed to expose an active region of the semiconductor substrate 100.

In order to form junctions in the semiconductor substrate 100 having the isolation layers 102 formed therein, an ion implantation process is carried out. A junction is formed within the active region up to a deep region, and first to fifth ion implantation processes of controlling the threshold voltage is performed. A condition for the ion implantation processes may vary depending on the semiconductor substrate 100 and the depth of a junction region. The ion implantation processes may be performed as follows.

The first ion implantation process may be performed by using boron (B) ions at a concentration of 2.0E13, with energy of 300 keV, and at a tilt angle of 3.2 degrees. The second ion implantation process may be performed by using boron (B) ions at a concentration of 3.0E12, with energy of 120 keV, and at a tilt angle of 7 degrees. The third ion implantation process may be performed by using boron (B) ions at a concentration of 9.0E12, with energy of 45 keV, and at a tilt angle of 7 degrees. The fourth ion implantation process may be performed by using phosphorous (P) ions at a concentration of 6.0E12, with energy of 25 keV, and at a tilt angle of 7 degrees. The fifth ion implantation process may be performed by using arsenic (As) ions at a concentration of 8.0E12, with energy of 20 keV, and at a tilt angle of 7 degrees. Due to this, a channel can be formed in part of the active region having a bridge shape to be formed later on.

Figure 1A:
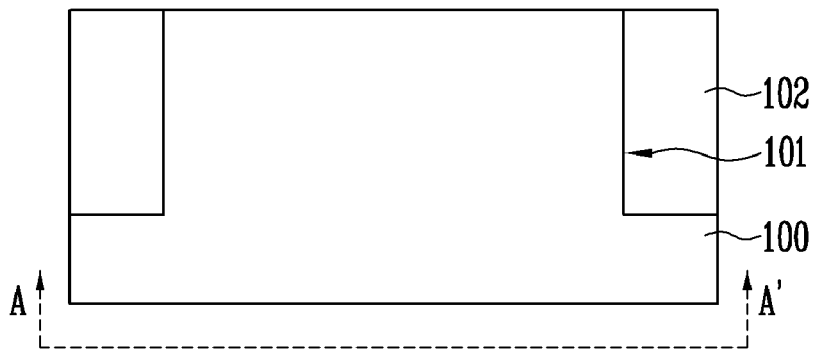
FIGS. 1A to 1J are sectional views illustrating a method of fabricating a semiconductor device according to an embodiment of the present invention.
Figure 1B:
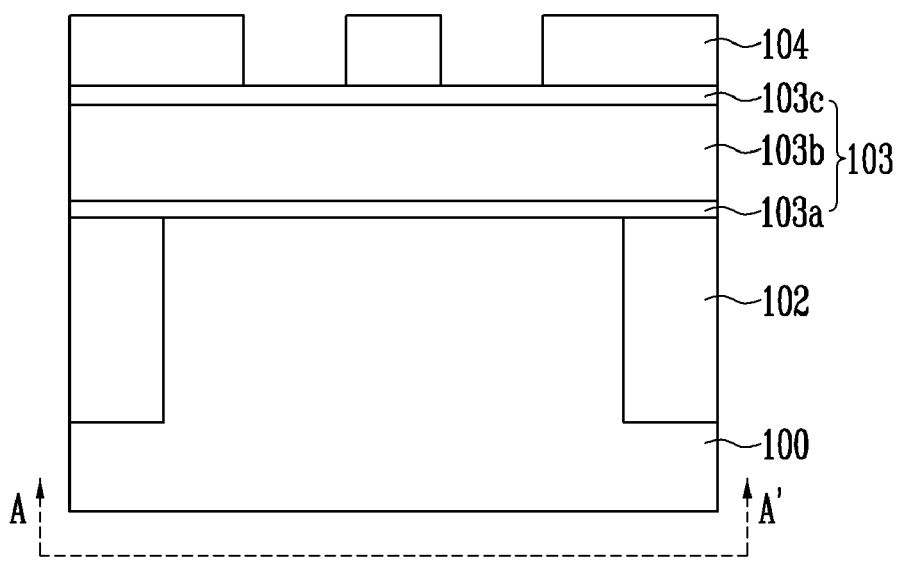

Referring to FIG. 1B, a first hard mask film 103 is formed on the semiconductor substrate 100 having the junction formed therein. The first hard mask film 103 may have a stack structure of a $SiO_2$ layer 103a, an amorphous carbon layer 103b, and a SiON layer 103c. The $SiO_2$ layer 103a can be formed to a thickness of 500 angstrom, the amorphous carbon layer 103b can be formed to a thickness of 500 angstrom, and the SiON layer 103c can be formed to a thickness of 400 angstrom. A first photoresist pattern 104 is formed on the first hard mask film 103.

Figure 3A:
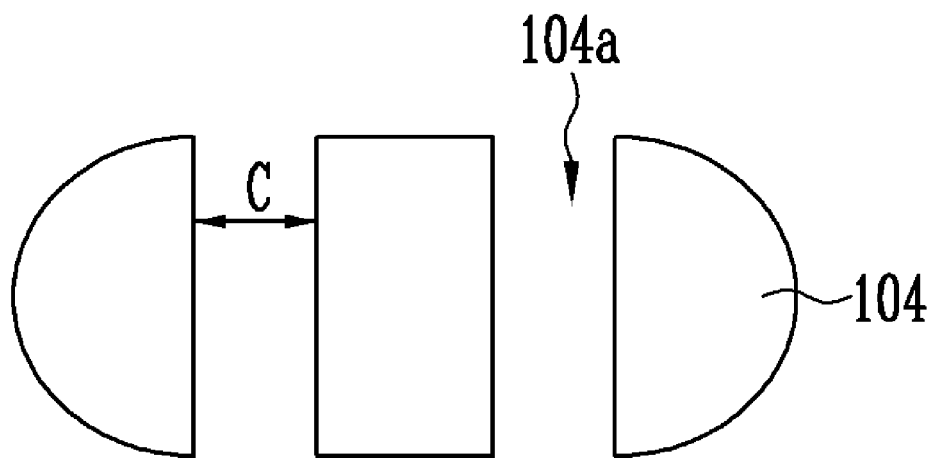
FIGS. 3A to 3B are plan views illustrating a mask film pattern according to an embodiment of the present invention.

The first photoresist pattern 104 may be preferably formed with reference to FIG. 3A. Although the first photoresist pattern 104 may also be formed in the isolation region other than the active region, it is illustrated, in FIG. 3A, that the first photoresist pattern 104 is formed within the active region for convenience of description. A plurality of apertures may be formed within the active region. In the present embodiment, however, a pattern having two apertures 104a is described as an example. A width C of the aperture 104a may range from 65 to 75 angstrom.

Figure 1C:
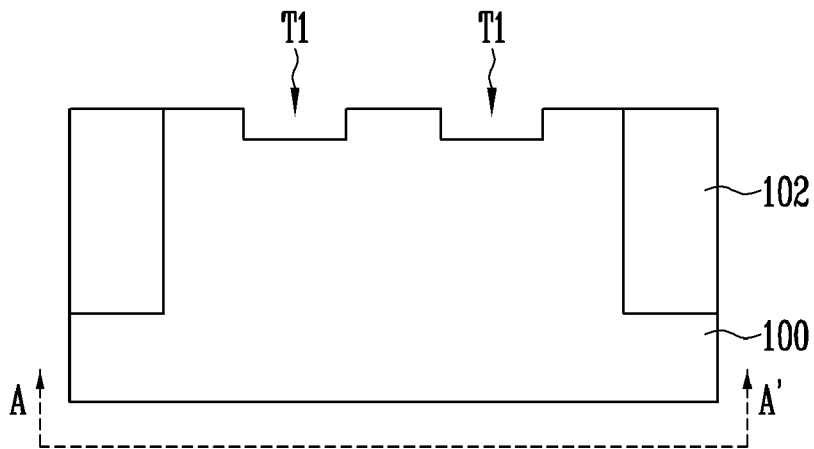
Figure 2A:
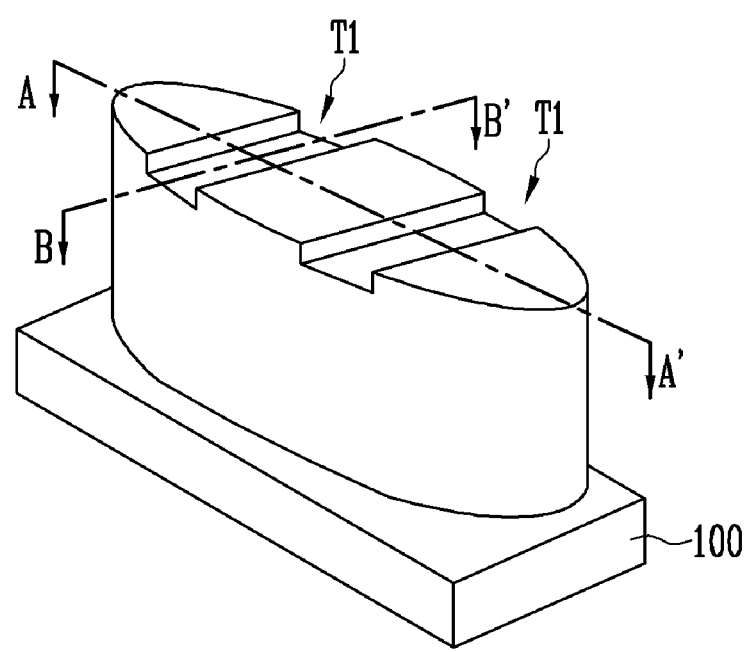
FIGS. 2A to 2C are three-dimensional views illustrating the structure of the semiconductor device according to an embodiment of the present invention.

Referring to FIG. 1C, the first hard mask film (refer to 103 of FIG. 1B) is patterned by performing an etch process along the first photoresist pattern (refer to 104 of FIG. 1B). The first photoresist pattern (refer to 104 of FIG. 1B) is then removed. A part of the exposed semiconductor substrate 100 is removed by performing an etch process along the patterned first hard mask film (refer to 103 of FIG. 1B), thus forming trenches T1. Each of the trenches T1 may have a depth of 20 nm. After the trenches T1 are formed, the first hard mask film (refer to 103 of FIG. 1B) is removed. The trenches T1 are thereby completed, as shown in the three-dimensional view of FIG. 2A. FIG. 2A is a three-dimensional view illustrating the active region of the semiconductor substrate 100 except for the isolation layers in order to help the understanding of the present invention. FIG. 2A shows a structure in which the trenches T1 are formed on the active region.

Figure 1D:
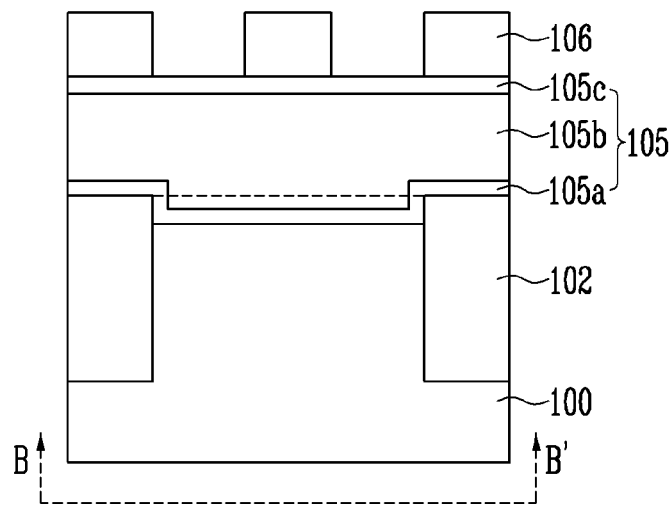

FIG. 1D shows a sectional view of the device taken along line B-B' in the three-dimensional view of FIG. 2A. A second hard mask film 105 is formed on the semiconductor substrate 100 having the trenches (refer to T1 of FIG. 1C) formed therein. The second hard mask film 105 may have a stack structure of a $SiO_2$ layer 105a, an amorphous carbon layer 105b, and a SiON layer 105c. The $SiO_2$ layer 105a can be formed to a thickness of 500 angstrom, the amorphous carbon layer 105b can be formed to a thickness of 500 angstrom, and the SiON layer 105c can be formed to a thickness of 400 angstrom. A second photoresist pattern 106 is formed on the second hard mask film 105.

Figure 3B:
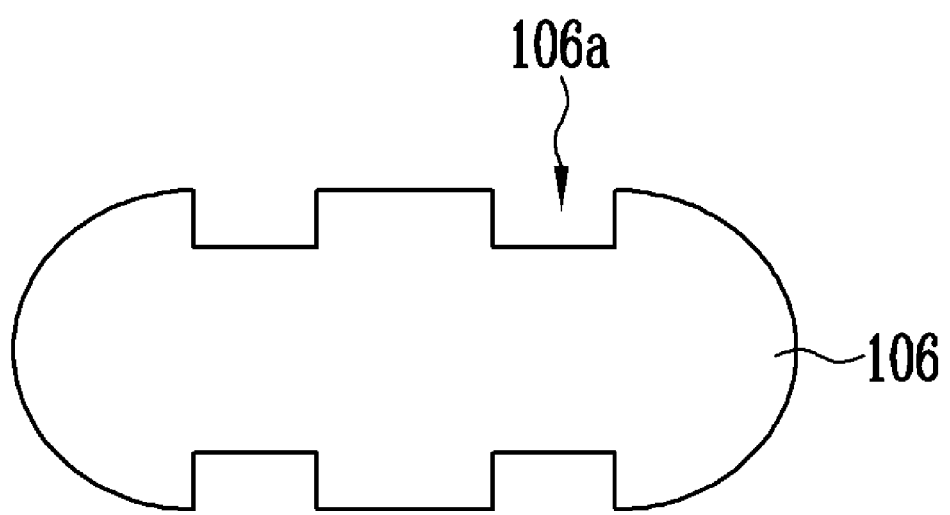

The second photoresist pattern 106 is described below with reference to FIG. 3B. FIG. 3B is a plan view of the second photoresist pattern 106 formed in the active region. The second photoresist pattern 106 has a pattern having regions 106a, which are partially opened toward the inside of the region in which the trenches (refer to T1 of FIG. 1C) are formed.

Figure 1E:
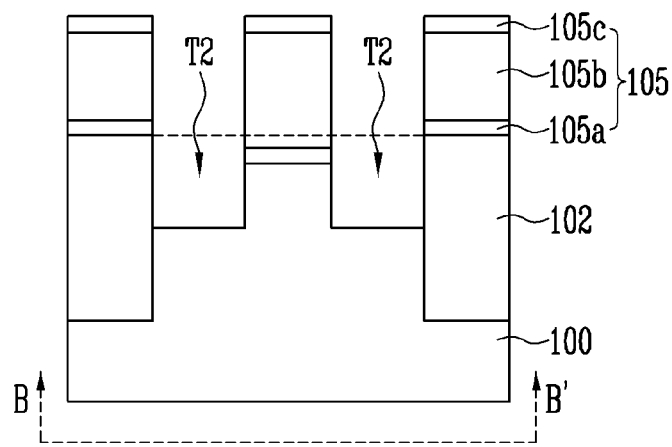

Referring to FIG. 1E, the second hard mask film 105 is patterned by performing an etch process along the second photoresist pattern (refer to 106 of FIG. 1D). The second photoresist pattern (refer to 106 of FIG. 1D) is then removed. A part of the exposed semiconductor substrate 100 is removed by performing an anisotropic dry etch process along the patterned second hard mask film 105, thus forming a hole T2. The hole T2 may have a depth of 85 nm. Since the depth of the trench (refer to T1 of FIG. 1C) is 20 nm, a depth from a top surface of the semiconductor substrate 100 to a bottom surface of the hole T2 can be 105 nm. In particular, the depth of the hole T2 may be the same as or deeper than the depth in which the junction region is formed in the foregoing ion implantation process, so that a subsequent channel active region can be included in the junction region.

Figure 1F:
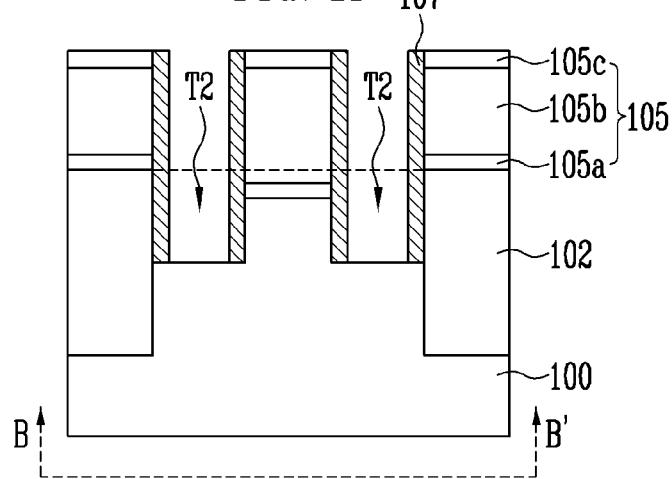

Referring to FIG. 1F, an etch protection layer 107 is formed along the surface of the semiconductor substrate 100, including the sidewalls of the hole T2. The etch protection layer 107 is a layer for protecting the sidewalls of the hole T2 at the time of a subsequent etch process, and may be formed of a nitride layer or an oxide layer. The remaining etch protection layer 107 other than the etch protection layer 107 on the sidewalls of the hole T2 is removed by performing an anisotropic dry etch process. Consequently, the semiconductor substrate 100 is exposed at the bottom of the hole T2.

Figure 1G:
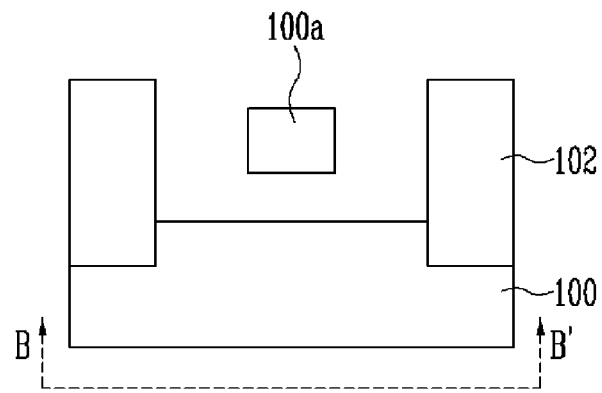

Referring to FIG. 1G, an etch process is performed along the pattern of the second hard mask film (refer to 105 of FIG. 1F). In this case, since the sidewalls of the hole (refer to [[T1]] T2 of FIG. 1F) are protected by the etch protection layer (refer to 107 of FIG. 1F), only the semiconductor substrate 100 exposed at the bottom of the hole (refer to T2 of FIG. 1F) is etched. Further, the etch process may be performed by using an isotropic dry etch process employing a plasma type equipment. The etch process is described below in detail. The etch process may be performed by injecting an etch gas at a pressure of 1 mTorr to 100 mTorr, plasma source power of 1 W to 1000 W and 1V to 500V, and a plasma density of 1E5 to 1E12 at a temperature of −50 to 50 degrees Celsius. The injected etch gas may include a mixed gas of CF4, Ar, Cl2, HBr, SF6 and O2.

If the isotropic dry etch process is carried out, the semiconductor substrate is widely etched at the bottom of the hole (refer to T2 of FIG. 1F). The bottoms of the holes (refer to T2 of FIG. 1E) are penetrated to form a channel active region 100a. A depth of the hole formed at the bottom of the channel active region 100a may range from 400 to 500 angstrom from the bottom of the channel active region 100a. The channel active region 100a may have a cubic shape or a rectangular shape depending on a photoresist pattern and an etch depth. Furthermore, at the time of the etch process of implementing the channel active region 100a, the edge of the channel active region 100a is etched and curved. It can reduce a disturbance phenomenon due to an electromagnetic field concentrated at the edge area. After the channel active region 100a is formed, the second hard mask film (refer to 105 of FIG. 1F) is removed. Then, the etch protection layer (refer to 107 of FIG. 1F) and process residues are removed, and a cleaning process is performed so as to perform a subsequent process efficiently. The cleaning process may be performed by using a buffered oxide etchant (BOE) in which $NH_4F$ and HF are mixed at a ratio of 1 to 1000:1, a solution in which HF and DI water are mixed at a ratio of 1 to 1000:1, or a solution in which $NH_4OH$, $H_2O_2$ and $H_2O$ are mixed.

Figure 2B:
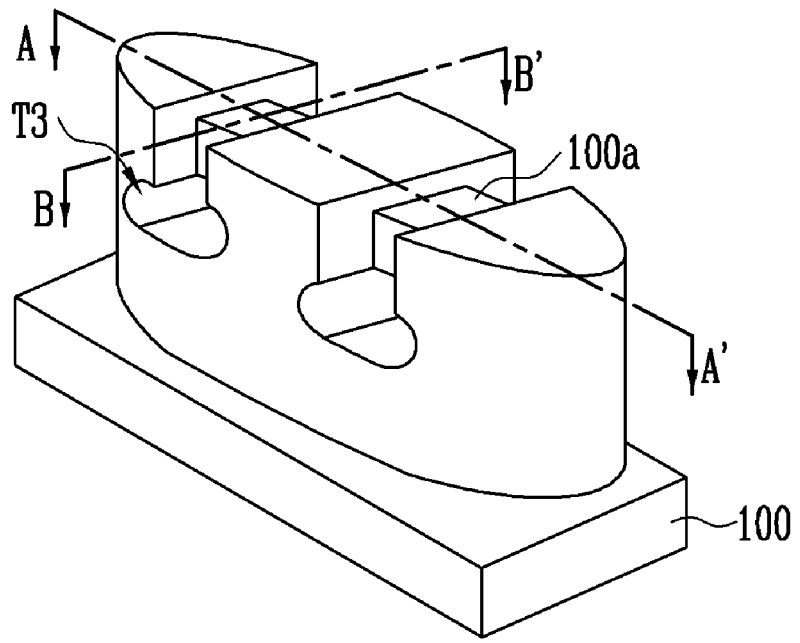

The active region formed thus has a structure in which the channel active region 100a is formed within a trench T3 as illustrated in the three-dimensional view of FIG. 2B. At the time of an etch process of forming the channel active region 100a, the bottom of the trench T3 is likely to have a bulb shape having a wide bottom as in FIG. 2B. However, the shape of the bottom of the trench T3 may vary depending on an etch process condition, etc.

Figure 1H:
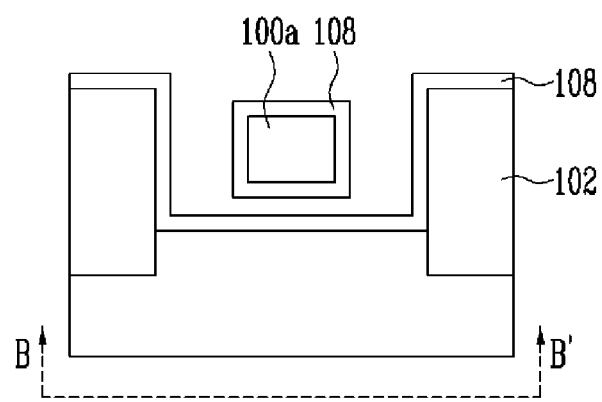

Referring to FIG. 1H, a gate insulating layer 108 is formed along the surface of the semiconductor substrate 100 having the channel active region 100a formed therein. The gate insulating layer 108 may be formed to a thickness of 40 to 50 angstrom on the whole surface of the structure, including the channel active region 100a, by oxidizing the surface of the structure through a dry oxidization process at a temperature of 800 to 900 degrees Celsius.

Figure 1I:
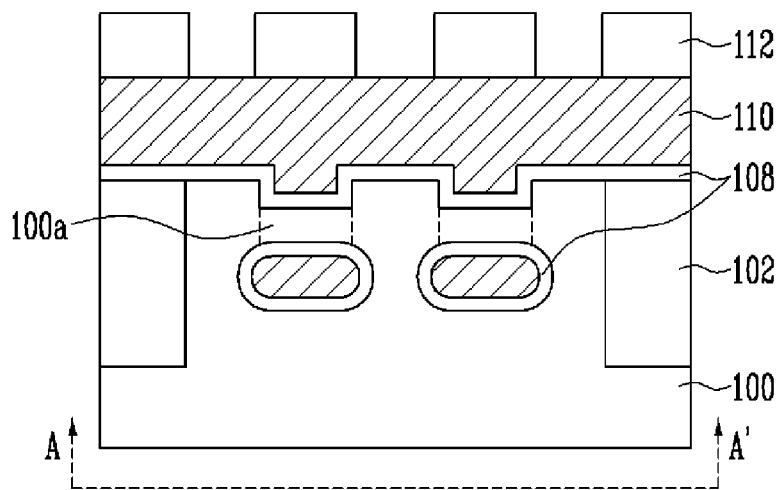

Referring to FIG. 1I, a gate electrode layer 110 is formed over the semiconductor substrate 100 having the gate insulating layer 108 formed therein so that the hole having the channel active region 100a formed therein is filled. The gate electrode layer 110 may have a stack structure of a polysilicon layer, a barrier metal layer, and a metal layer. A gate hard mask film pattern 112 is formed on the gate electrode layer 110. The gate hard mask film pattern 112 may be formed of an amorphous carbon layer.

Figure 1J:
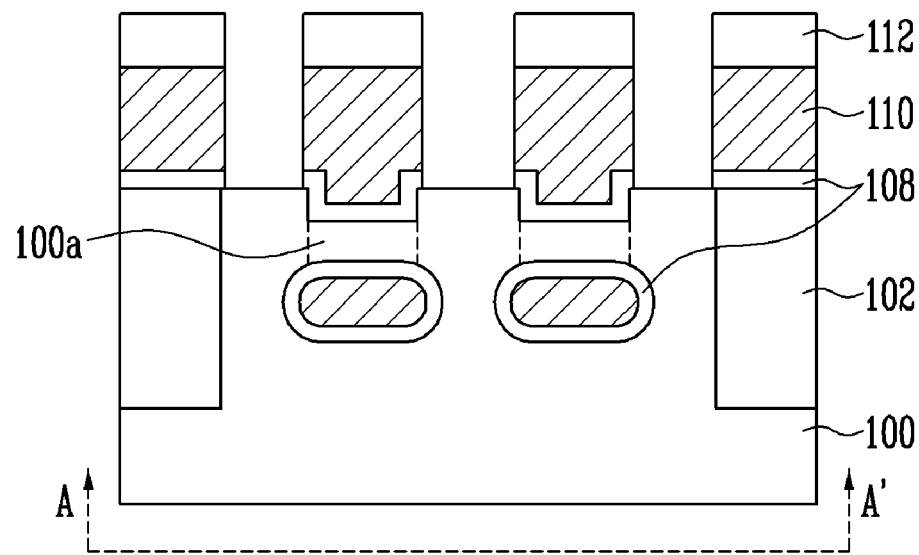

Referring to FIG. 1J, the gate electrode layer 110 and the gate insulating layer 108 are patterned by performing an etch process along the gate hard mask film pattern 112.

Thus, the semiconductor device having the four channels can be formed. This is described below in more detail with reference to FIG. 2C.

Figure 2C:
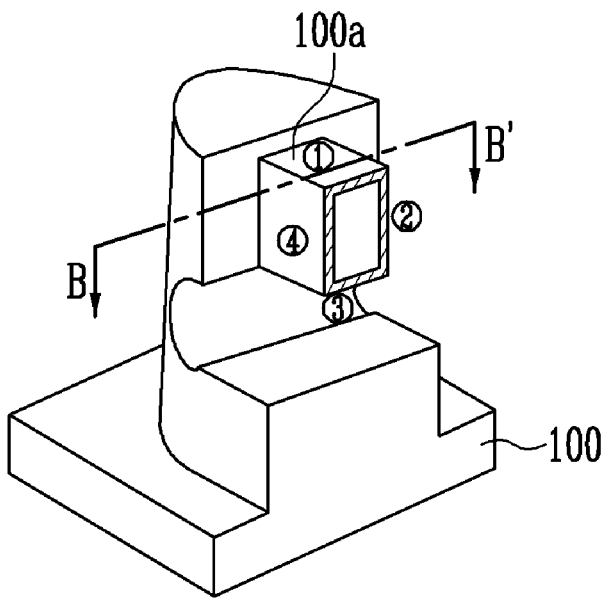

FIG. 2C is a three-dimensional view illustrating the cross section of the active region of the semiconductor device having four channels. In the cross section of the channel active region 100a, if subsequent operating voltage is applied, four channels ① to ④ are formed near the surface of the channel active region 100a. Since the channel active region 100a is surrounded by the gate electrode layer (refer to 110 of FIG. 1I), the occurrence of the leakage current can be reduced. It is therefore possible to prevent an off-leakage phenomenon in which the current is leaked before the gate is on.

FIGS. 4A to 4G are sectional views illustrating a method of fabricating a semiconductor device according to another embodiment of the present invention.

FIGS. 4A to 4G are sectional views illustrating a method of fabricating a semiconductor device having six channels.

Figure 4A:
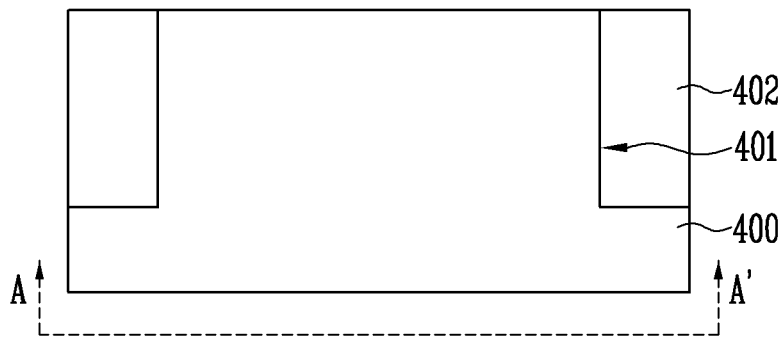
FIGS. 4A to 4G are sectional views illustrating a method of fabricating a semiconductor device according to another embodiment of the present invention.
Figure 4B:
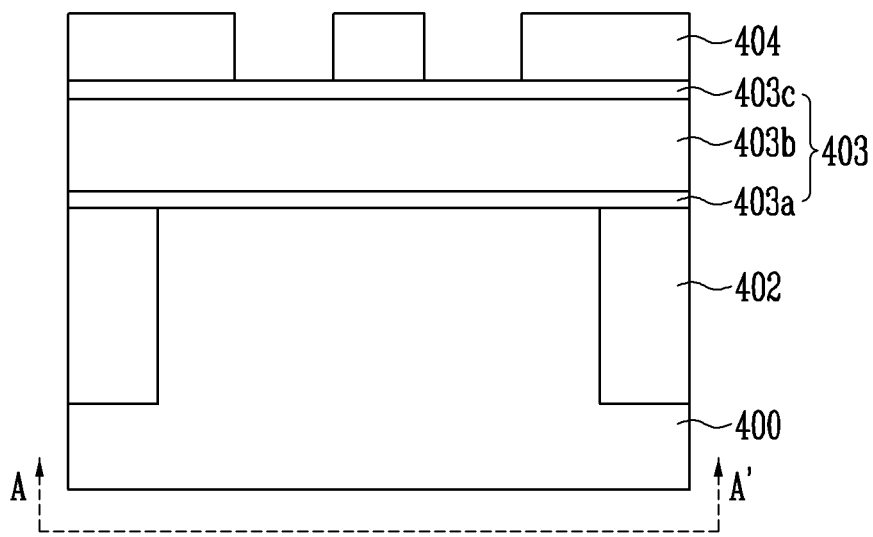
Figure 4C:
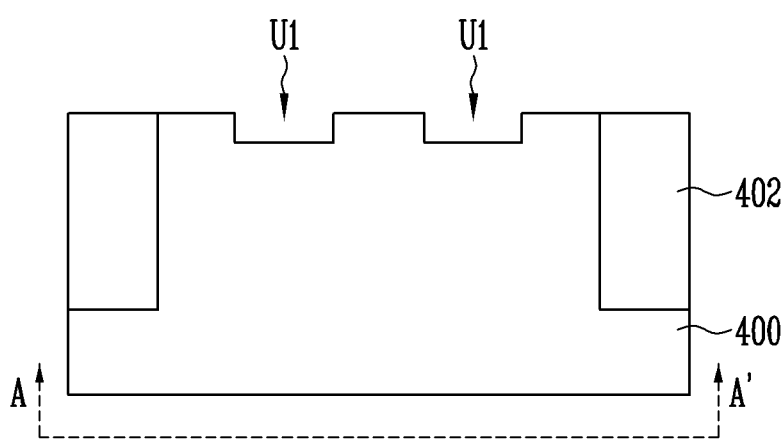
Figure 4D:
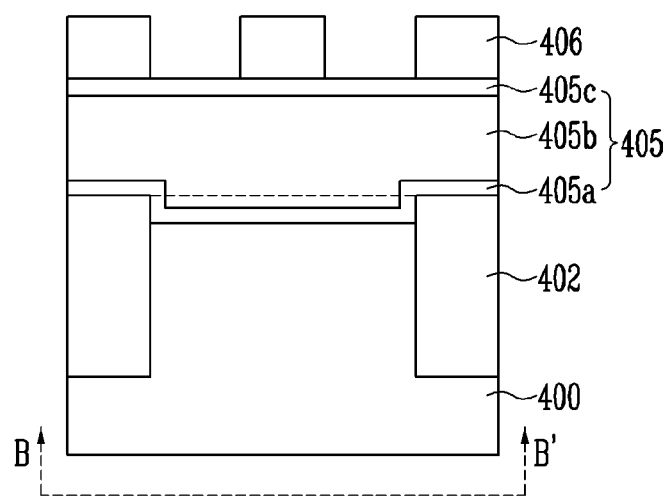
Figure 4E:
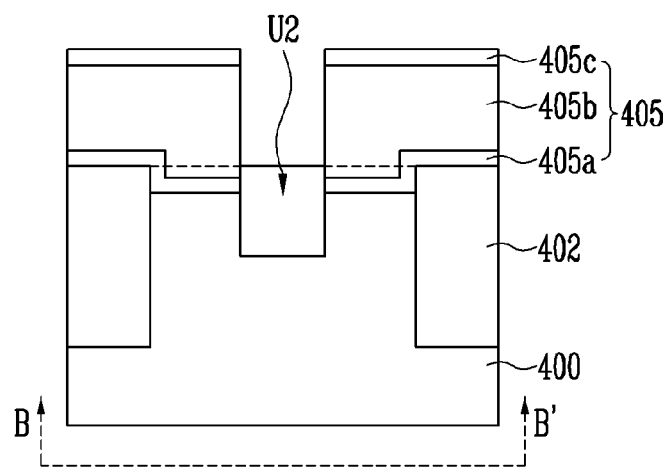
Figure 4F:
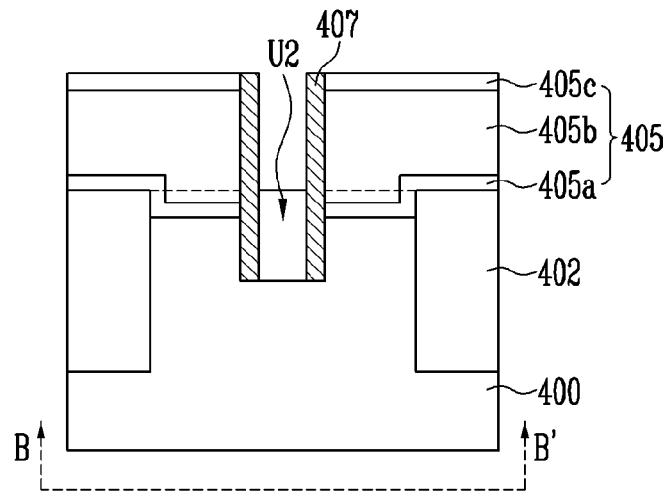
Figure 4G:
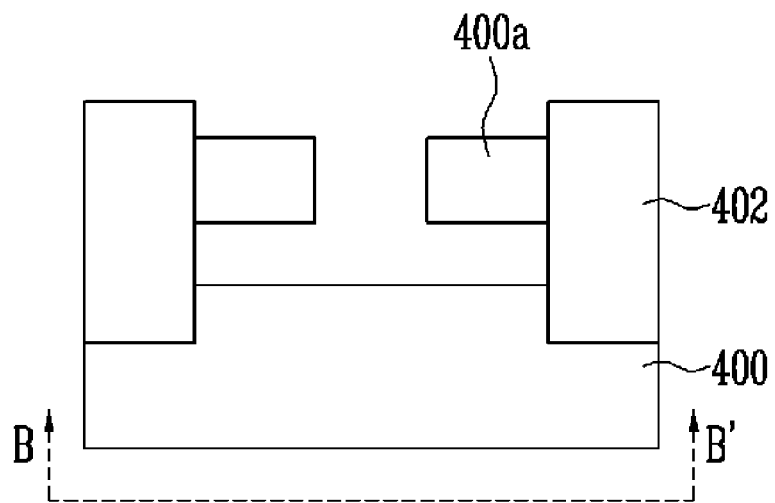
Figure 5A:
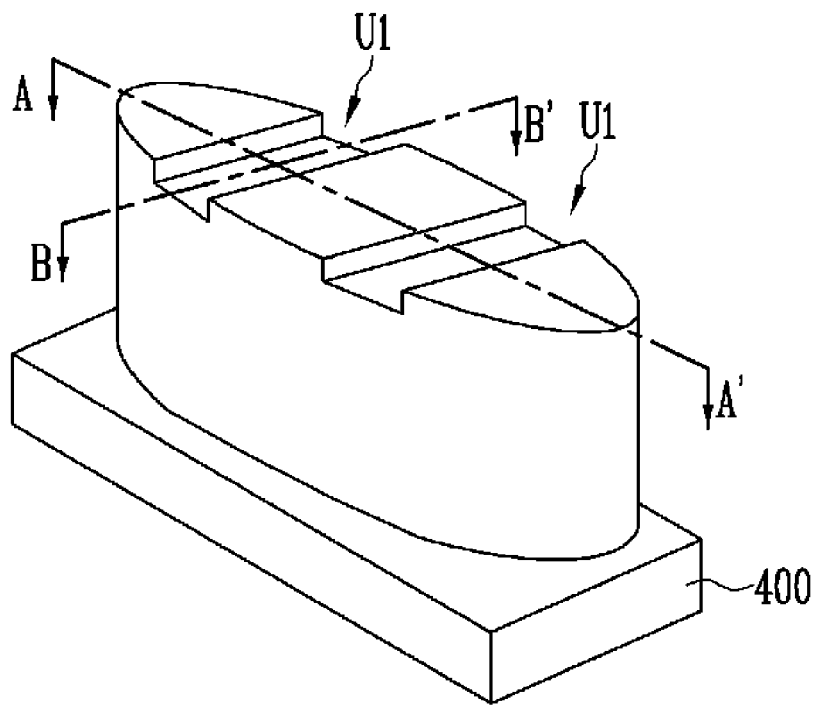
FIGS. 5A to 5C are three-dimensional views illustrating the structure of the semiconductor device according to another embodiment of the present invention.

Here, FIGS. 4A to 4C are sectional views taken along line A-A' of FIG. 5A which illustrates a three-dimensional view of an active region according to the present embodiment while FIGS. 4D to 4G are taken along line B-B'. The fabrication method is described below with reference to FIG. 4A. A mask film pattern (not shown) is formed on a semiconductor substrate 400 in which wells are formed. A part of the semiconductor substrate 400 is removed by performing an etch process along the mask film pattern (not shown), thus forming trenches 401. The trenches 401 are filled with an insulating layer to form isolation layers 402. After the isolation layers 402 are formed, chemical mechanical polishing (CMP) is performed to expose an active region of the semiconductor substrate 400.

In order to form junctions in the semiconductor substrate 400 having the isolation layers 402 formed therein, an ion implantation process is carried out. A junction is formed within the active region up to a deep region, and first to fifth ion implantation processes of controlling the threshold voltage is performed. A condition for the ion implantation processes may vary depending on the semiconductor substrate 400 and the depth of a junction region. The ion implantation processes may be performed as follows.

The first ion implantation process may be performed by using boron (B) ions at a concentration of 2.0E13, with energy of 300 keV, and at a tilt angle of 3.2 degrees. The second ion implantation process may be performed by using boron (B) ions at a concentration of 3.0E12, with energy of 120 keV, and at a tilt angle of 7 degrees. The third ion implantation process may be performed by using boron (B) ions at a concentration of 9.0E12, with energy of 45 keV, and at a tilt angle of 7 degrees. The fourth ion implantation process may be performed by using phosphorous (P) ions at a concentration of 6.0E12, with energy of 25 keV, and at a tilt angle of 7 degrees. The fifth ion implantation process may be performed by using arsenic (As) ions at a concentration of 8.0E12, with energy of 20 keV, and at a tilt angle of 7 degrees. Due to this, a channel can be formed in part of the active region having a bridge shape to be formed later on.

Referring to FIG. 4B, a first hard mask film 403 is formed on the semiconductor substrate 400 having the junction formed therein. The first hard mask film 403 may have a stack structure of a $SiO_2$ layer 403a, an amorphous carbon layer 403b, and a SiON layer 403c. The $SiO_2$ layer 403a can be formed to a thickness of 500 angstrom, the amorphous carbon layer 403b can be formed to a thickness of 500 angstrom, and the SiON layer 403c can be formed to a thickness of 400 angstrom. A first photoresist pattern 404 is formed on the first hard mask film 403.

Figure 6A:
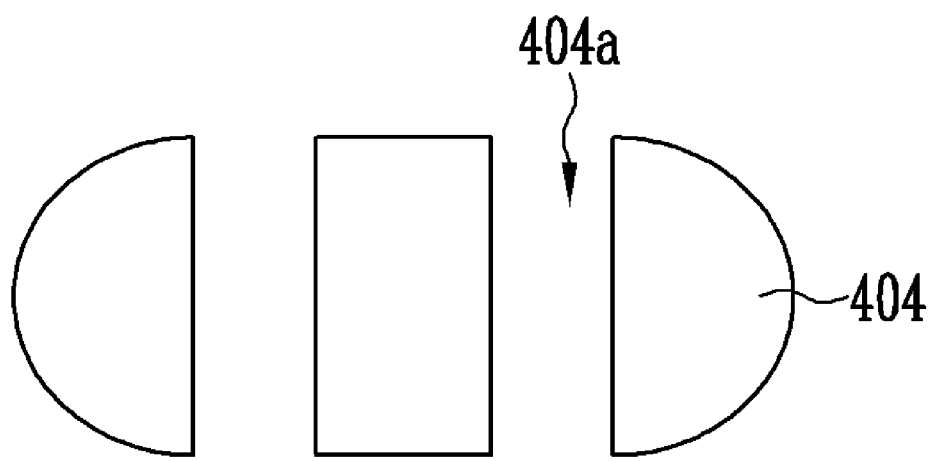
FIGS. 6A to 6B are plan views illustrating a mask film pattern according to another embodiment of the present invention.

The first photoresist pattern 404 may be preferably formed with reference to FIG. 6A. FIG. 6A is a plan view of the first photoresist pattern 404 formed within the active region. While a plurality of apertures to form gates therein may be formed within the active region, the present embodiment forms the first photoresist pattern 404 having two aperture regions 404a.

Referring to FIG. 4C, the first hard mask film (refer to 403 of FIG. 4B) is patterned by performing an etch process along the first photoresist pattern (refer to 404 of FIG. 4B). The first photoresist pattern (refer to 404 of FIG. 4B) is then removed. A part of the exposed semiconductor substrate 400 is removed by performing an etch process along the patterned first hard mask film (refer to 403 of FIG. 4B), thus forming trenches U1. Each of the trenches U1 may have a depth of 20 nm. After the trenches U1 are formed, the patterned first hard mask film (refer to 403 of FIG. 4B) is removed. The trenches U1 are thereby completed as shown in the three-dimensional view of FIG. 5A. FIG. 5A is a three-dimensional view illustrating the active region of the semiconductor substrate 400 except for the isolation layers in order to help the understanding of the present invention. FIG. 5A shows a structure in which the trenches U1 are formed on the active region.

FIG. 4D is a sectional view of the device taken along line B-B' in the three-dimensional view of FIG. 5A. A second hard mask film 405 is formed on the semiconductor substrate 400 having the trenches (refer to U1 of FIG. 4C) formed therein. The second hard mask film 405 may have a stack structure of a $SiO_2$ layer 405a, an amorphous carbon layer 405b, and a SiON layer 405c. The $SiO_2$ layer 405a can be formed to a thickness of 500 angstrom, the amorphous carbon layer 405b can be formed to a thickness of 500 angstrom, and the SiON layer 405c can be formed to a thickness of 400 angstrom. A second photoresist pattern 406 is formed on the second hard mask film 405.

Figure 6B:
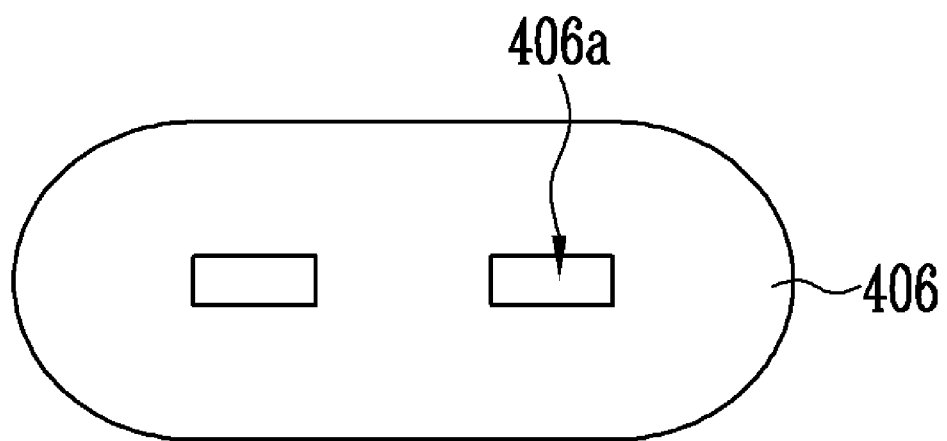

The second photoresist pattern 406 is described below with reference to FIG. 6B. FIG. 6B is a plan view of the second photoresist pattern 406 formed in the active region. The second photoresist pattern 406 has a pattern having regions 406a, which are partially opened toward the inside of the region in which the trenches (refer to U1 of FIG. 4C) are formed.

Referring to FIG. 4E, the second hard mask film 405 is patterned by performing an etch process along the second photoresist pattern (refer to 406 of FIG. 4D). The second photoresist pattern (refer to 406 of FIG. 4D) is then removed. A part of the exposed semiconductor substrate 400 is removed by performing an anisotropic dry etch process along the patterned second hard mask film 405, thus forming a hole U2. The hole U2 may have a depth of 85 nm. Since the depth of the trench (refer to U1 of FIG. 4C) is 20 nm, a depth from a top surface of the semiconductor substrate 400 to a bottom surface of the hole U2 can be 105 nm. In particular, the depth of the hole U2 may be the same as or deeper than the depth in which the junction region is formed in the foregoing ion implantation process, so that a subsequent channel active region can be included in the junction region.

Referring to FIG. 4F, an etch protection layer 407 is formed along the surface of the semiconductor substrate 400, including the sidewalls of the hole U2. The etch protection layer 407 is a layer for protecting the sidewalls of the hole U2 at the time of a subsequent etch process, and may be formed of a nitride layer or an oxide layer. The remaining etch protection layer 407 other than the etch protection layer 407 on the sidewalls of the hole U2 is removed by performing an anisotropic dry etch process. Consequently, the semiconductor substrate 400 is exposed at the bottom of the hole U2.

Referring to FIG. 4G, an etch process is performed along the pattern of the second hard mask film (refer to 405 of FIG. 4F). In this case, since the sidewalls of the hole (refer to U2 of FIG. 4F) are protected by the etch protection layer (refer to 407 of FIG. 4F), only the semiconductor substrate 400 exposed at the bottom of the hole (refer to U2 of FIG. 4F) is etched. Further, the etch process may be performed by using an isotropic dry etch process employing a plasma type equipment. The etch process is described below in detail. The etch process may be performed by injecting an etch gas at a pressure of 1 mTorr to 100 mTorr, plasma source power of 1 W to 1000 W and 1V to 500V, and a plasma density of 1E5 to 1E12 at a temperature of −50 to 50 degrees Celsius. The injected etch gas may include a mixed gas of $CF_4$, Ar, $Cl_2$, HBr, $SF_6$ and $O_2$.

If the isotropic dry etch process is carried out, the semiconductor substrate is widely etched at the bottom of the hole (refer to U2 of FIG. 4F). The bottom of the hole (refer to U2 of FIG. 4E) is penetrated to form a channel active region 400a having a protruding shape. A depth of the hole formed at the bottom of the channel active region 400a may range from 400 to 500 angstrom from the bottom of the channel active region 400a. After the channel active region 400a is formed, the second hard mask film (refer to 405 of FIG. 4F) is removed. The etch protection layer 407 and process residues are removed, and a cleaning process is performed so as to perform a subsequent process efficiently. The cleaning process may be performed by using a BOE in which $NH_4F$ and HF are mixed at a ratio of 1 to 1000:1, a solution in which HF and DI water are mixed at a ratio of 1 to 1000:1, or a solution in which $NH_4OH$, $H_2O_2$ and $H_2O$ are mixed.

Figure 5B:
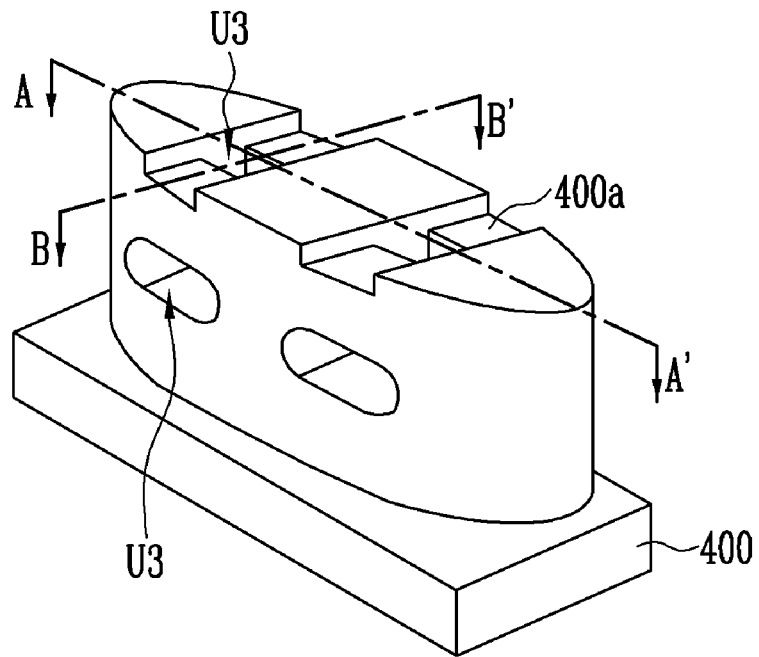

The active region formed thus has a structure in which the channel active region 400a is formed within a trench U3 as illustrated in the three-dimensional view of FIG. 5B. At the time of an etch process of forming the channel active region 400a, the bottom of the trench U3 is likely to have a bulb shape. The shape of the bottom of the trench U3 may vary depending on an etch process condition, etc.

Thus, the semiconductor device having six channels can be formed. This is described below in more detail with reference to FIG. 5C.

Figure 5C:
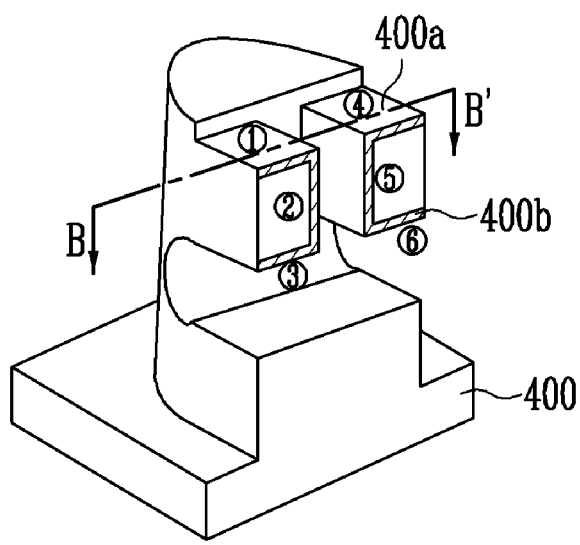

FIG. 5C is a three-dimensional view illustrating the cross section of the active region of the semiconductor device having six channels. In the cross section of the channel active region 400a, if subsequent operating voltage is applied, six channels ① to ⑥ are formed near the surface of the channel active region 400a. Since the channel active region 400a is surrounded by a gate electrode layer to be formed in a subsequent process, the occurrence of the leakage current can be reduced. It is therefore possible to prevent an off-leakage phenomenon in which the current is leaked before the gate is on.

FIGS. 7A to 7G are sectional views illustrating a method of fabricating a semiconductor device according to still another embodiment of the present invention.

Figure 7A:
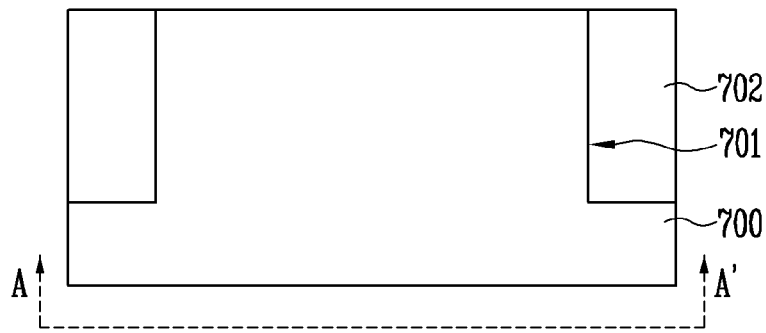
FIGS. 7A to 7G are sectional views illustrating a method of fabricating a semiconductor device according to still another embodiment of the present invention.
Figure 7B:
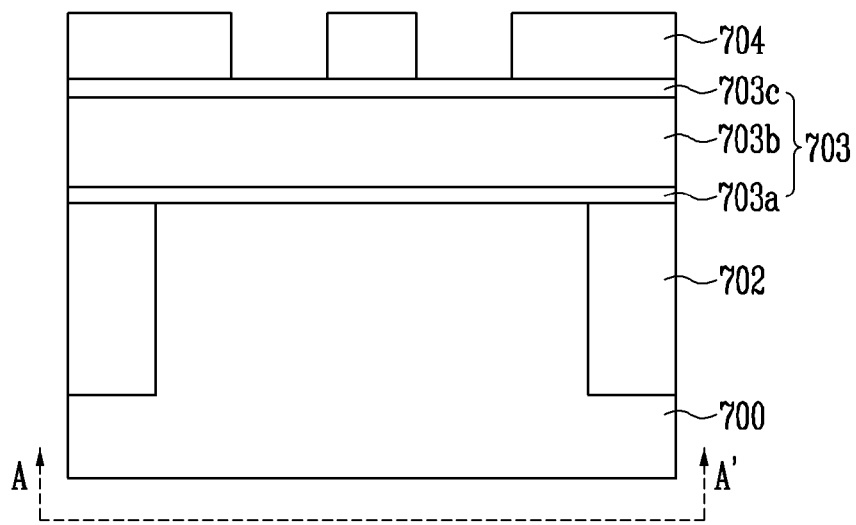
Figure 7C:
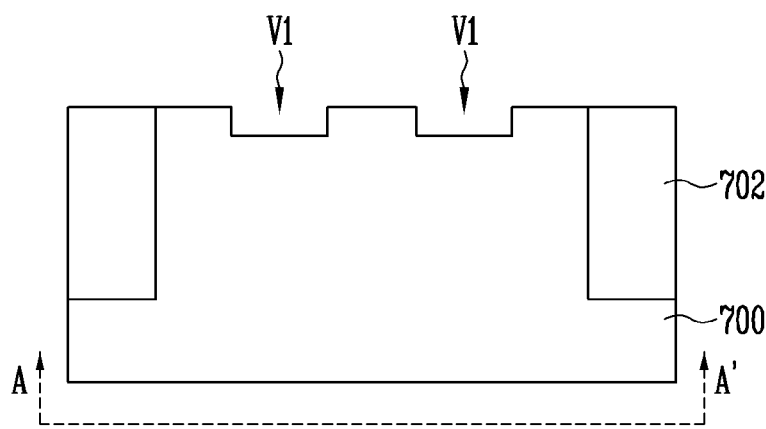

FIGS. 7A to 7G are sectional views illustrating a method of fabricating a semiconductor device having eight channels. Here, FIGS. 7A to 7C are sectional views taken along line A-A' of FIG. 8A which illustrates a three-dimensional view of an active region according to the present embodiment while FIGS. 7D to 7G are taken along line B-B'. The fabrication method is described below with reference to FIG. 7A. A mask film pattern (not shown) is formed on a semiconductor substrate 700 in which wells are formed. A part of the semiconductor substrate 700 is removed by performing an etch process along the mask film pattern (not shown), thus forming trenches 701. The trenches 701 are filled with an insulating layer to form isolation layers 702. After the isolation layers 702 are formed, a CMP process is performed to expose an active region of the semiconductor substrate 700.

In order to form junctions in the semiconductor substrate 700 having the isolation layers 702 formed therein, an ion implantation process is carried out. A junction is formed within the active region up to a deep region, and first to fifth ion implantation processes of controlling the threshold voltage is performed. A condition for the ion implantation processes may vary depending on the semiconductor substrate 700 and the depth of a junction region. The ion implantation processes may be performed as follows.

The first ion implantation process may be performed by using boron (B) ions at a concentration of 2.0E13, with energy of 300 keV, and at a tilt angle of 3.2 degrees. The second ion implantation process may be performed by using boron (B) ions at a concentration of 3.0E12, with energy of 120 keV, and at a tilt angle of 7 degrees. The third ion implantation process may be performed by using boron (B) ions at a concentration of 9.0E12, with energy of 45 keV, and at a tilt angle of 7 degrees. The fourth ion implantation process may be performed by using phosphorous (P) ions at a concentration of 6.0E12, with energy of 25 keV, and at a tilt angle of 7 degrees. The fifth ion implantation process may be performed by using arsenic (As) ions at a concentration of 8.0E12, with energy of 20 keV, and at a tilt angle of 7 degrees. Due to this, a channel can be formed in part of the active region having a bridge shape to be formed later on.

Referring to FIG. 7B, a first hard mask film 703 is formed on the semiconductor substrate 700 having the junction formed therein. The first hard mask film 703 may have a stack structure of a $SiO_2$ layer 703a, an amorphous carbon layer 703b, and a SiON layer 703c. The $SiO_2$ layer 703a can be formed to a thickness of 500 angstrom, the amorphous carbon layer 703b can be formed to a thickness of 500 angstrom, and the SiON layer 703c can be formed to a thickness of 400 angstrom. A first photoresist pattern 704 is formed on the first hard mask film 703.

Figure 9A:
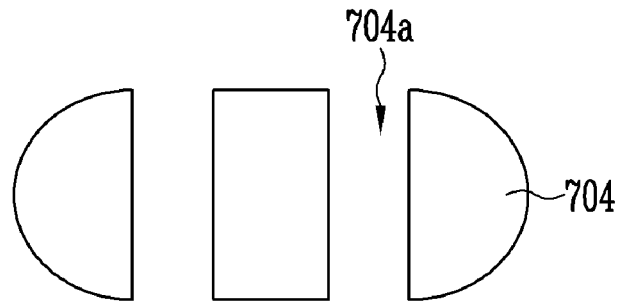
FIGS. 9A to 9B are plan views illustrating a mask film pattern according to still another embodiment of the present invention.

The first photoresist pattern 704 may be preferably formed with reference to FIG. 9A. FIG. 9A is a plan view of the first photoresist pattern 704 formed within the active region. While a plurality of apertures to form gates therein may be formed within the active region, the present embodiment forms the first photoresist pattern 704 having two aperture regions 704a.

Figure 8A:
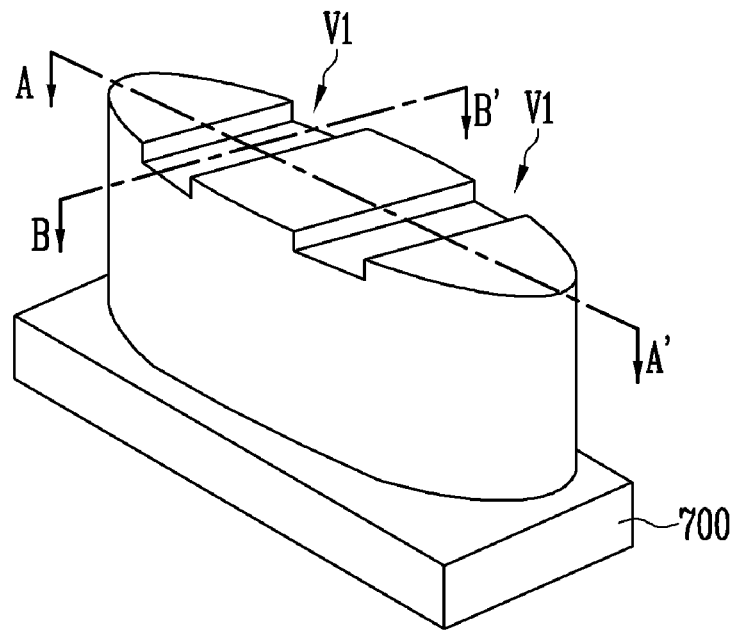
FIGS. 8A to 8C are three-dimensional views illustrating the structure of the semiconductor device according to still another embodiment of the present invention.

Referring to FIG. 7C, the first hard mask film (refer to 703 of FIG. 7B) is patterned by performing an etch process along the first photoresist pattern (refer to 704 of FIG. 7B). The first photoresist pattern (refer to 704 of FIG. 7B) is then removed. A part of the exposed semiconductor substrate 700 is removed by performing an etch process along the patterned first hard mask film (refer to 703 of FIG. 7B), thus forming trenches V1. Each of the trenches V1 may have a depth of 20 nm. After the trenches V1 are formed, the patterned first hard mask film (refer to 703 of FIG. 7B) is removed. The trenches V1 are thereby completed as shown in the three-dimensional view of FIG. 8A. FIG. 8A is a three-dimensional view illustrating the active region of the semiconductor substrate 700 except for the isolation layers in order to help the understanding of the present invention. FIG. 8A shows a structure in which the trenches V1 are formed on the active region.

Figure 7D:
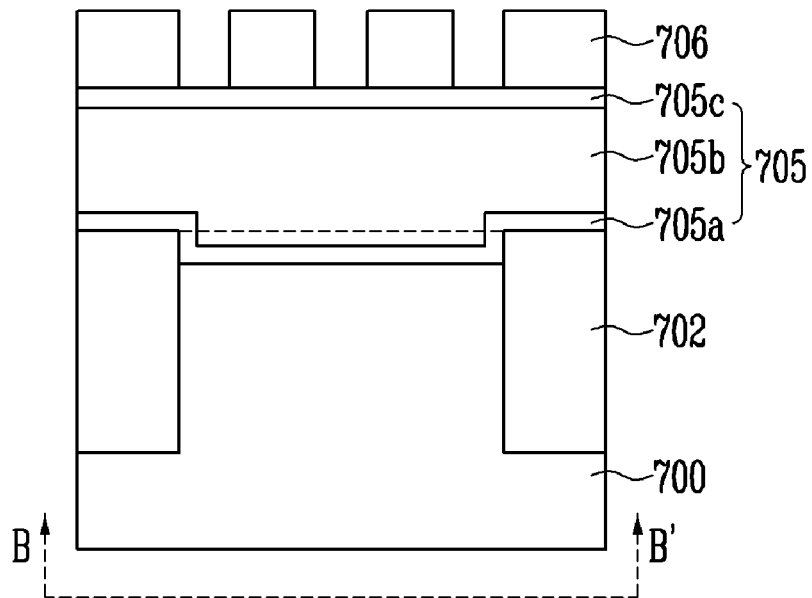

FIG. 7D is a sectional view of the device taken along line B-B' in the three-dimensional view of FIG. 8A. A second hard mask film 705 is formed on the semiconductor substrate 700 having the trenches (refer to V1 of FIG. 7C) formed therein. The second hard mask film 705 may have a stack structure of a $SiO_2$ layer 705a, an amorphous carbon layer 705b, and a SiON layer 705c. The $SiO_2$ layer 705a can be formed to a thickness of 500 angstrom, the amorphous carbon layer 705b can be formed to a thickness of 500 angstrom, and the SiON layer 705c can be formed to a thickness of 400 angstrom. A second photoresist pattern 706 is formed on the second hard mask film 705.

Figure 9B:
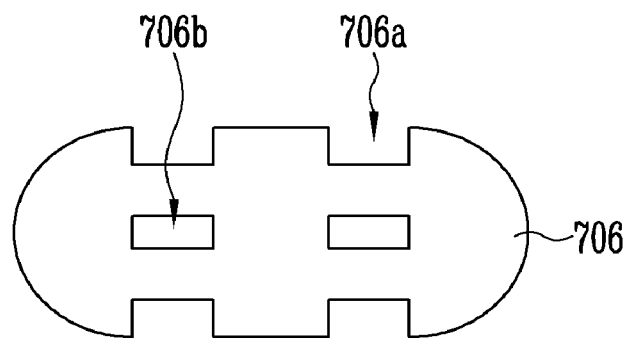

The second photoresist pattern 706 is described below with reference to FIG. 9B. FIG. 9B is a plan view of the second photoresist pattern 706 formed in the active region. The second photoresist pattern 706 has a pattern having regions 706a, which are partially opened toward the inside of the region in which the trenches (refer to V1 of FIG. 7C) are formed.

Figure 7E:
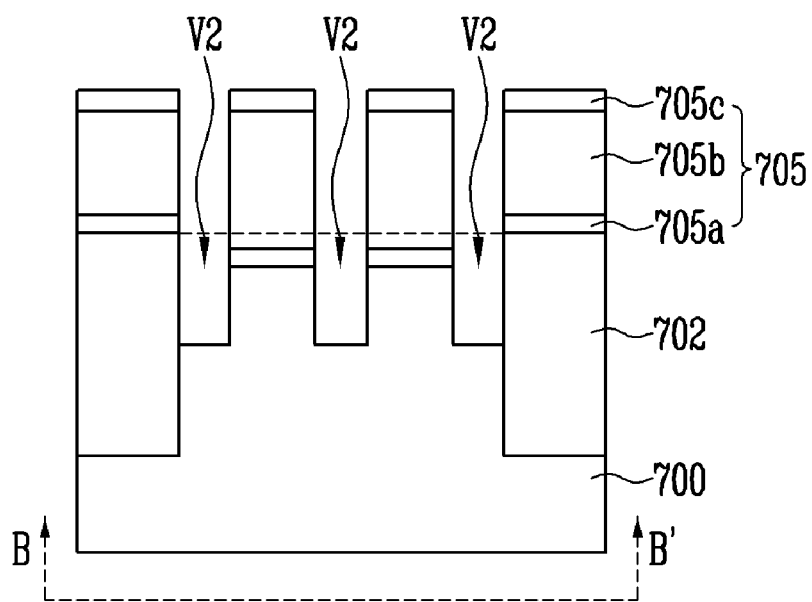

Referring to FIG. 7E, the second hard mask film 705 is patterned by performing an etch process along the second photoresist pattern (refer to 706 of FIG. 7D). The second photoresist pattern (refer to 706 of FIG. 7D) is then removed. A part of the exposed semiconductor substrate 700 is removed by performing an anisotropic dry etch process along the patterned second hard mask film 705, thus forming a hole V2. The hole V2 may have a depth of 85 nm. Since the depth of the trench (refer to V1 of FIG. 7C) is 20 nm, a depth from a top surface of the semiconductor substrate 700 to a bottom surface of the hole V2 can be 105 nm. In particular, the depth of the hole V2 may be the same as or deeper than the depth in which the junction region is formed in the foregoing ion implantation process, so that a subsequent channel active region can be included in the junction region.

Figure 7F:
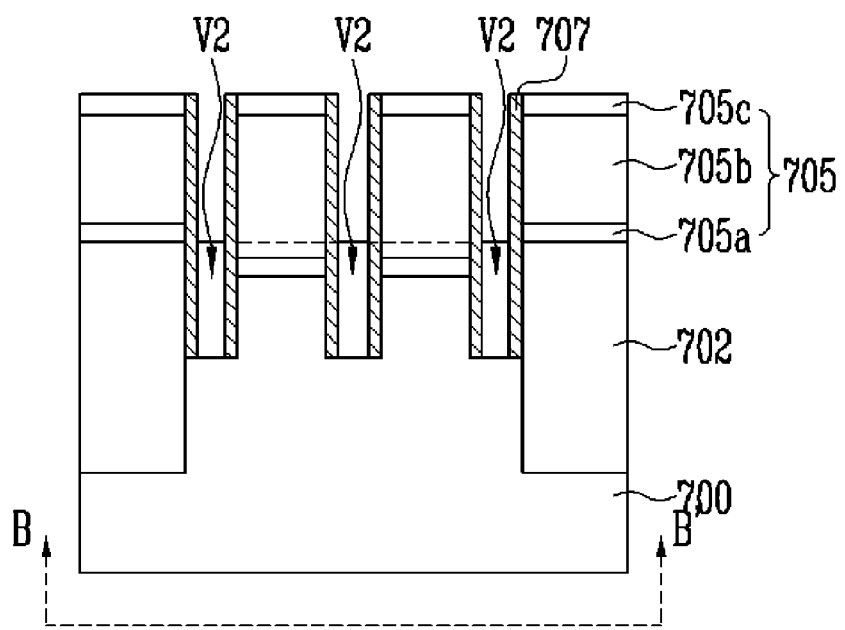

Referring to FIG. 7F, an etch protection layer 707 is formed along the surface of the semiconductor substrate 700, including the sidewalls of the hole V2. The etch protection layer 707 is a layer for protecting the sidewalls of the hole V2 at the time of a subsequent etch process, and may be formed of a nitride layer or an oxide layer. The remaining etch protection layer 707 other than the etch protection layer 707 on the sidewalls of the hole V2 is removed by performing an anisotropic dry etch process. Consequently, the semiconductor substrate 700 is exposed at the bottom of the hole V2.

Figure 7G:
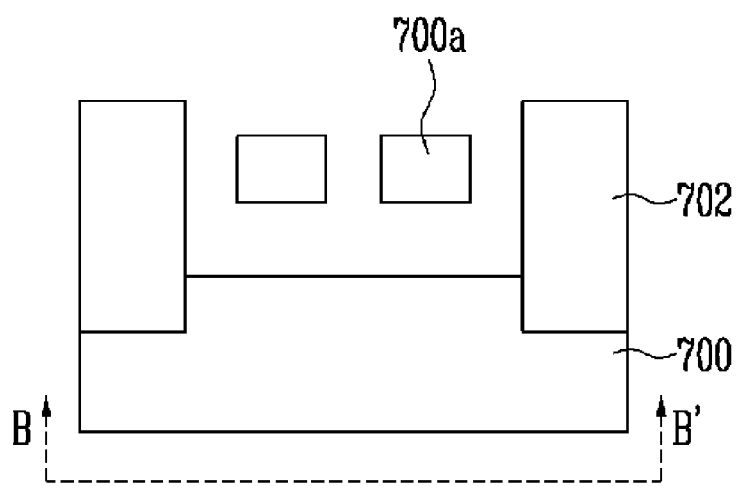

Referring to FIG. 7G, an etch process is performed along the pattern of the second hard mask film (refer to 705 of FIG. 7F). In this case, since the sidewalls of the hole (refer to V2 of FIG. 7F) are protected by the etch protection layer (refer to 707 of FIG. 7F), only the semiconductor substrate 700 exposed at the bottom of the hole (refer to V2 of FIG. 7F) is etched. Further, the etch process may be performed by using an isotropic dry etch process employing a plasma type equipment. The etch process is described below in detail. The etch process may be performed by injecting an etch gas at a pressure of 1 mTorr to 100 mTorr, plasma source power of 1 W to 1000 W and 1V to 500V, and a plasma density of 1E5 to 1E12 at a temperature of −50 to 50 degrees Celsius. The injected etch gas may include a mixed gas of $CF_4$, Ar, $Cl_2$, HBr, $SF_6$ and $O_2$.

If the isotropic dry etch process is carried out, the semiconductor substrate is widely etched at the bottom of the hole (refer to V2 of FIG. 7F). The bottom of the hole (refer to V2 of FIG. 7E) is penetrated to form a channel active region 700a. A depth of the hole formed at the bottom of the channel active region 700a may range from 400 to 500 angstrom from the bottom of the channel active region 700a. After the channel active region 700a is formed, the second hard mask film (refer to 705 of FIG. 7F) is removed. The etch protection layer 707 and process residues are removed, and a cleaning process is performed so as to perform a subsequent process efficiently. The cleaning process may be performed by using a BOE in which $NH_4F$ and HF are mixed at a ratio of 1 to 1000:1, a solution in which HF and DI water are mixed at a ratio of 1 to 1000:1, or a solution in which $NH_4OH$, $H_2O_2$ and $H_2O$ are mixed.

Figure 8B:
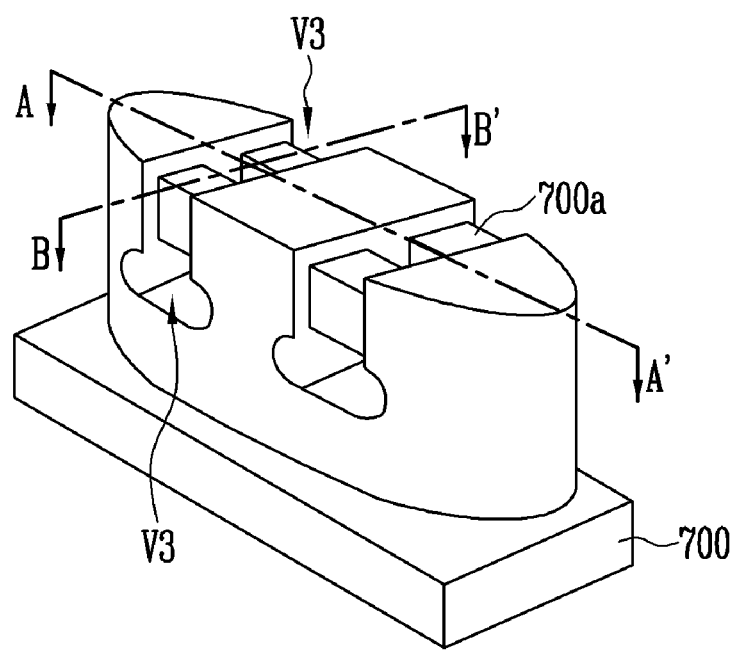

The active region formed thus has a structure in which the channel active region 700a is formed within a trench V3 as illustrated in the three-dimensional view of FIG. 8B. At the time of an etch process of forming the channel active region 700a, the bottom of the trench V3 is likely to have a bulb shape. The shape of the bottom of the trench V3 may vary depending on an etch process condition, etc.

Thus, the semiconductor device having eight channels can be formed. This is described below in more detail with reference to FIG. 8C.

Figure 8C:
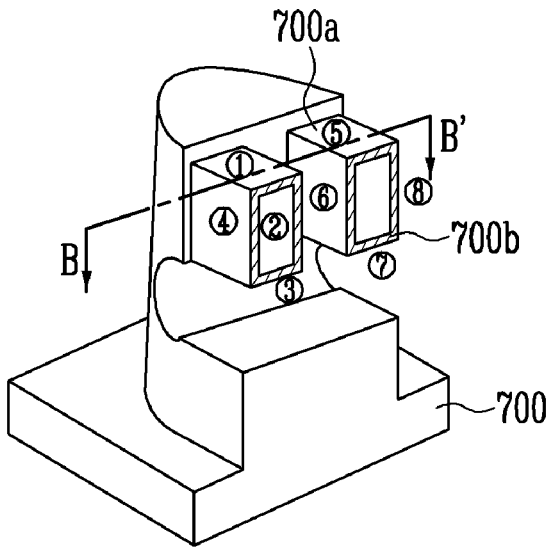

FIG. 8C is a three-dimensional view illustrating the cross section of the active region of the semiconductor device having eight channels. In the cross section of the channel active region 700a, if subsequent operating voltage is applied, eight channels ① to ⑧ are formed near the surface of the channel active region 700a. Since the channel active region 700a is surrounded by a gate electrode layer to be formed in a subsequent process, the occurrence of the leakage current can be reduced. It is therefore possible to prevent an off-leakage phenomenon in which the current is leaked before the gate is on.

Meanwhile, the amount of driving current may vary depending on the shape of the channel active region. A detailed example in semiconductor devices applying the design rule of 66 nm is described below. Listed in <table 1> is an example in which the channel active region has a square cross section and has a length of 50 nm.

TABLE 1

|  | Total length of channel (nm) | Increasing rate of length per cell structure (%) | Driving current (μA/cell) |
| --- | --- | --- | --- |
| 1 channel | 50 | 100 | 30 |
| 3 channel | 150 | 300 | 90 |
| 4 channel | 200 | 133 | 120 |
| 6 channel | 300 | 150 | 180 |
| 8 channel | 400 | 133 | 240 |

Listed in <table 2> is another example in which the channel active region has a rectangular cross section having a longitudinal length of 50 nm and a traverse length of 85 nm.

TABLE 2

|  | Total length of channel (nm) | Increasing rate of length per cell structure (%) | Driving current (μA/cell) |
| --- | --- | --- | --- |
| 1 channel | 50 | 100 | 30 |
| 3 channel | 185 | 375 | 111 |
| 4 channel | 270 | 180 | 162 |
| 6 channel | 370 | 137 | 222 |
| 8 channel | 540 | 146 | 324 |

Tables 1 and 2 illustrate examples that were presented to help easy understanding of the amount of driving current depending on an increase of channels. Thus, the values listed in the tables may vary. From the tables, it can be seen that as the number of channels increases, the total length of channel also increases and the driving current increases accordingly.

Further, the number of channels can be further increased according to the above fabrication methods and, therefore, the leakage current can be prohibited effectively.

In accordance with the present invention, before forming a gate electrode, the shape of an active region of a semiconductor substrate is changed to have a plurality of channels.

To this end, a top surface of the active region is partially removed by performing a first etch process employing a first mask film pattern. A second etch process employing a second mask film pattern is performed to form a hole within the active region, obtaining a plurality of channels. Accordingly, the occurrence of the leakage current can be reduced, and an off-leakage phenomenon in which the current is leaked before the gate is on can be prevented accordingly.

Although the foregoing description has been made with reference to the specific embodiments, it is to be understood that changes and modifications of the present patent may be made by the ordinary skilled in the art without departing from the spirit and scope of the present patent and appended claims.

What is claimed is:

1. A method of fabricating a semiconductor device, the method comprising:
    forming a first trench in an active region of a semiconductor substrate having isolation layers formed therein;
    forming at least one hole within the semiconductor substrate below a portion of the first trench so that at least one hole is connected to the first trench;
    forming an etch mask over the semiconductor substrate to open a bottom portion of the at least one hole;
    forming a second trench within the semiconductor substrate below the at least one hole by performing an isotropic etch process using the etch mask so that the second trench is connected to the at least one hole; and
    removing the etch mask, thereby defining a channel active region within the semiconductor substrate by the first trench, the at least one hole, and the second trench.

2. A method of claim 1, wherein the at least one hole comprises holes which are formed on both sides of the first trench.

3. A method of claim 1, wherein the at least one hole comprises a hole which is formed at a center of the first trench.

4. A method of claim 1, wherein the at least one hole comprises holes which are formed on both sides and at a center of the first trench.

5. The method of claim 1, further comprising:
    after defining the channel active region, forming a gate insulating layer over the semiconductor substrate in which the channel active region is defined; and
    forming a gate electrode over the gate insulating layer.

6. The method of claim 1, wherein the formation of the first trench comprises:
    forming a first hard mask film and a first photoresist pattern over the semiconductor substrate in which the isolation layers are formed;
    performing an etch process along the first photoresist pattern to pattern the first hard mask film;
    removing the first photoresist pattern;
    removing a part of the semiconductor substrate by performing an anisotropic etch process using the patterned first hard mask film; and
    removing the patterned first hard mask film.

7. The method of claim 6, wherein a width of an opened region of the first photoresist pattern ranges from 65 to 75 angstrom.

8. The method of claim 6, wherein the first trench is formed in a depth of 15 nm to 25 nm.

9. The method of claim 1, wherein the formation of the at least one hole comprises:
    forming a second hard mask film and a second photoresist pattern over the semiconductor substrate in which the first trench is formed;
    patterning the second hard mask film along the second photoresist pattern;
    removing the second photoresist pattern; and
    removing a part of the semiconductor substrate by performing an anisotropic etch process using the patterned second hard mask film.

10. The method of claim 9, wherein the at least one hole is formed in a depth of 80 to 90 nm.

11. The method of claim 1, wherein the isotropic etch process is performed by using an isotropic dry etch process employing a plasma type equipment.

12. The method of claim 11, wherein the isotropic dry etch process is performed by injecting an etch gas at a pressure of 1 mTorr to 100 mTorr and a plasma density of 1E5 to 1E12 by using plasma source power of 1 W to 1000 W and 1V to 500V at a temperature of −50 to 50 degrees Celsius.

13. The method of claim 12, wherein the etch gas employs a mixed gas of $CF_4$, Ar, $Cl_2$, HBr, $SF_6$ and $O_2$.

14. The method of claim 1, wherein after the etch mask is removed, a cleaning process is performed.

15. The method of claim 14, wherein the cleaning process is performed by using BOE in which $NH_4F$ and HF are mixed at a ratio of 1 to 1000:1, a solution in which HF and DI (deionized) water are mixed at a ratio of 1 to 1000:1, or a solution in which $NH_4OH$, $H_2O_2$ and $H_2O$ are mixed.

* * * * *